(12) United States Patent
Kim et al.

(10) Patent No.: US 11,529,655 B2
(45) Date of Patent: Dec. 20, 2022

(54) NOZZLE, SUBSTRATE PROCESSING APPARATUS INCLUDING THE SAME, AND SUBSTRATE PROCESSING METHOD

(71) Applicant: SEMES CO., LTD., Cheonan-si (KR)

(72) Inventors: Sunmi Kim, Yeongam-gun (KR); Oh Jin Kwon, Cheonan-si (KR); Sehyeong Choi, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 9 days.

(21) Appl. No.: 17/009,051

(22) Filed: Sep. 1, 2020

(65) Prior Publication Data

US 2021/0060622 A1    Mar. 4, 2021

(30) Foreign Application Priority Data

Sep. 2, 2019 (KR) .......................... 10-2019-0108097

(51) Int. Cl.
*B08B 13/00* (2006.01)
*B08B 3/02* (2006.01)
*B08B 6/00* (2006.01)
*B08B 7/04* (2006.01)

(52) U.S. Cl.
CPC .................. *B08B 3/02* (2013.01); *B08B 6/00* (2013.01); *B08B 7/04* (2013.01)

(58) Field of Classification Search
None
See application file for complete search history.

(56) References Cited

U.S. PATENT DOCUMENTS

| | | | |
|---|---|---|---|
| 6,211,622 B1 | 4/2001 | Ryoji et al. | |
| 2004/0149386 A1 | 8/2004 | Numasawa et al. | |
| 2008/0173327 A1* | 7/2008 | Miyagi | B05B 7/0433 204/661 |
| 2009/0277389 A1* | 11/2009 | Kakimoto | C23C 16/4404 118/725 |
| 2013/0206720 A1* | 8/2013 | Blom | H05H 1/24 156/345.43 |

FOREIGN PATENT DOCUMENTS

| | | |
|---|---|---|
| CN | 101207015 A | 6/2008 |
| CN | 102823331 A | 12/2012 |
| CN | 103065987 A | 4/2013 |
| CN | 103447256 A | 12/2013 |

(Continued)

OTHER PUBLICATIONS

Office Action for Korean Application No. 10-2019-0108097 dated Jan. 13, 2021, not in Eglish.

(Continued)

*Primary Examiner* — Eric W Golightly
(74) *Attorney, Agent, or Firm* — Harness, Dickey & Pierce, P.L.C.

(57) ABSTRACT

The inventive concept provides a nozzle for dispensing a treatment liquid in which plasma is generated. The nozzle includes a body having an interior space, a liquid supply unit that supplies the treatment liquid into the interior space, and electrodes that generate the plasma in the interior space. The liquid supply unit supplies the treatment liquid in a bubbling state into the interior space, or causes the treatment liquid to bubble in the interior space.

19 Claims, 8 Drawing Sheets

(56) References Cited

FOREIGN PATENT DOCUMENTS

| CN | 107303653 A | 10/2017 |
|---|---|---|
| CN | 108966648 A | 12/2018 |
| JP | 2008-153322 A | 7/2008 |
| JP | 2012-176353 A | 9/2012 |
| JP | 2018-529183 A | 10/2018 |
| KR | 10-2009-0103419 A | 10/2009 |
| KR | 101582627 B1 | 1/2016 |
| KR | 101807002 B1 | 1/2018 |

OTHER PUBLICATIONS

M. Sato et al., "Decomposition of Phenol in Water Using Water Surface Plasma in Wetted-wall Reactor", International Journal of Plasma Environmental Science & Technology vol. 1, No. 1, Mar. 2007, pp. 71-75.

Soo In Kim et al., "The study about accelerating Photoresist strip under plasma," Research Paper Journal of the Korean Vacuum Society, vol. 17, No. 2, pp. 113-116, Mar. 2008.

CA Office Action dated Apr. 19, 2022 in Chinese Application No. 202010909543.0.

* cited by examiner

FIG. 2

NOZZLE, SUBSTRATE PROCESSING APPARATUS INCLUDING THE SAME, AND SUBSTRATE PROCESSING METHOD

CROSS-REFERENCE TO RELATED APPLICATIONS

A claim for priority under 35 U.S.C. § 119 is made to Korean Patent Application No. 10-2019-0108097 filed on Sep. 2, 2019, in the Korean Intellectual Property Office, the entire contents of which are hereby incorporated by reference.

BACKGROUND

Embodiments of the inventive concept described herein relate to a nozzle, a substrate processing apparatus including the same, and a substrate processing method, and more particularly, relate to a nozzle for dispensing a treatment liquid onto a substrate to process the substrate, a substrate processing apparatus including the nozzle, and a substrate processing method.

With high-density, high-integration, and high-performance of semiconductor elements, scaling-down of circuit patterns rapidly proceeds. Therefore, contaminants such as particles, organic contaminants, metal contaminants, or the like remaining on a surface of a substrate greatly affect characteristics and production yield of semiconductor elements. Due to this, a cleaning process of removing various types of contaminants adhering to a substrate surface is emerging as a major issue in semiconductor manufacturing processes. The cleaning process is performed before and after each unit process of manufacturing semiconductor elements. The cleaning process is performed by dispensing a cleaning solution onto the rotating substrate by a dispensing nozzle.

As the critical dimension (CD) between patterns formed on a substrate becomes narrower, it is difficult to appropriately remove impurities between the patterns formed on the substrate or impurities adhering to the surface of the substrate.

To remove the impurities adhering to the surface of the substrate, a chemical is dispensed onto the surface of the substrate. The chemical is a substance having a chemical property suitable for removing the impurities adhering to the surface of the substrate. However, the chemical may decrease efficiency of work because the chemical requires special attention when handled. In addition, the chemical may cause environmental pollution. Accordingly, an environmentally-friendly substrate cleaning method for improving efficiency in removing impurities adhering to a surface of a substrate is required.

SUMMARY

Embodiments of the inventive concept provide a nozzle for efficiently processing a substrate, a substrate processing apparatus including the nozzle, and a substrate processing method.

Embodiments of the inventive concept provide a substrate processing apparatus and method for performing an environmentally-friendly cleaning process without using a chemical or by reducing the amount of a chemical used.

Embodiments of the inventive concept provide a nozzle for efficiently removing impurities adhering to a substrate, a substrate processing apparatus including the nozzle, and a substrate processing method.

Embodiments of the inventive concept provide a nozzle for efficiently generating plasma in a treatment liquid to be dispensed onto a substrate, a substrate processing apparatus including the nozzle, and a substrate processing method.

Embodiments of the inventive concept provide a nozzle for providing an additional factor in generating plasma in a treatment liquid, a substrate processing apparatus including the nozzle, and a substrate processing method.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for processing a substrate includes a housing having a processing space, a support unit that supports the substrate in the processing space, and a liquid dispensing unit including a nozzle that dispenses a treatment liquid onto the substrate supported on the support unit. The nozzle includes a body having an interior space, a liquid supply unit that supplies the treatment liquid into the interior space, a gas supply unit that supplies a gas into the interior space, and electrodes that generate plasma in the interior space. The liquid supply unit supplies the treatment liquid in a bubbling state into the interior space, or causes the treatment liquid to bubble in the interior space.

According to an embodiment, the liquid supply unit may include a liquid supply source and a liquid supply line that receives the treatment liquid from the liquid supply source. A liquid inlet port connected with the liquid supply line may be formed in the body, and the liquid inlet port may be provided such that the treatment liquid introduced into the interior space from the liquid inlet port collides with an inner wall of the body to bubble in the interior space.

According to an embodiment, the liquid inlet port may be provided to be oblique when viewed from the front of the body.

According to an embodiment, positions of the electrodes may be changed to change a discharge region along a lengthwise direction of the nozzle, the discharge region being a region of the interior space in which the plasma is generated from the treatment liquid or the gas.

According to an embodiment, the nozzle may further include an actuator that changes the positions of the electrodes.

According to an embodiment, the electrodes may include a first electrode provided in the interior space and a second electrode that surrounds the interior space. One of the first electrode and the second electrode may be fixed, and the other may be movable along the lengthwise direction of the nozzle.

According to an embodiment, the body may include an insulating part that surrounds the first electrode, and the second electrode may be movable along a lengthwise direction of the first electrode.

According to an embodiment, one of the first electrode and the second electrode may be connected with a power supply, and the other may be grounded.

According to an embodiment, the first electrode may be connected with the power supply, and the second electrode may be grounded.

According to an embodiment, the apparatus may further include a controller that controls the liquid dispensing unit. The gas supply unit may include a gas supply source and a gas supply line that receives the gas from the gas supply source. A gas inlet port connected with the gas supply line may be formed in the body, and the controller may control the gas supply source such that the type of the gas supplied into the interior space is changed depending on the type of the substrate to be processed.

According to an embodiment, the body may have a dispensing opening formed therein for dispensing the treatment liquid onto the substrate, which is supported on the support unit, in the manner of a stream.

According to an embodiment, the body may be implemented with an insulator.

According to an exemplary embodiment, a nozzle for dispensing a treatment liquid in which plasma is generated includes a body having an interior space, a liquid supply unit that supplies the treatment liquid into the interior space, and electrodes that generate the plasma in the interior space. The liquid supply unit supplies the treatment liquid in a bubbling state into the interior space, or causes the treatment liquid to bubble in the interior space.

According to an embodiment, the liquid supply unit may include a liquid supply source and a liquid supply line that receives the treatment liquid from the liquid supply source. A liquid inlet port connected with the liquid supply line may be formed in the body, and the liquid inlet port may be provided such that the treatment liquid introduced into the interior space from the liquid inlet port collides with an inner wall of the body to bubble in the interior space.

According to an embodiment, the liquid inlet port may be provided to be oblique when viewed from the front of the body.

According to an embodiment, positions of the electrodes may be changed to change a discharge region along a lengthwise direction of the nozzle, the discharge region being a region of the interior space in which the plasma is generated from the treatment liquid.

According to an embodiment, the nozzle may further include an actuator that changes the positions of the electrodes.

According to an embodiment, the electrodes may include a first electrode provided in the interior space and a second electrode that surrounds the interior space. One of the first electrode and the second electrode may be fixed, and the other may be movable along the lengthwise direction of the nozzle.

According to an embodiment, the body may include an insulating part that surrounds the first electrode, and the second electrode may be movable along a lengthwise direction of the first electrode.

According to an embodiment, the nozzle may further include a gas supply unit that supplies a gas into the interior space.

According to an embodiment, the body may have a dispensing opening formed therein for dispensing the treatment liquid in the manner of a stream.

According to an embodiment, the body may be implemented with an insulator.

According to an exemplary embodiment, a method for processing a substrate includes processing the substrate by dispensing a treatment liquid onto the substrate by a nozzle that dispenses the treatment liquid in which plasma is generated. The treatment liquid in a bubbling state is supplied into an interior space of the nozzle, or the treatment liquid bubbles in the interior space. The plasma is generated by applying voltage to the treatment liquid in the bubbling state.

According to an embodiment, an electrode that applies the voltage to the treatment liquid may surround the interior space, and a discharge region of the interior space in which the plasma is generated from the treatment liquid may be changed by changing the position of the electrode.

According to an embodiment, a gas may be supplied into the interior space of the nozzle, and the type of the gas supplied into the interior space may be changed depending on the type of the substrate processed by the treatment liquid.

According to an embodiment, the gas may include at least one of argon gas, hydrogen gas, oxygen gas, nitrogen gas, or carbon dioxide gas.

According to an embodiment, the treatment liquid may be a cleaning solution that cleans the substrate.

According to an embodiment, the cleaning solution may include deionized water.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 2 is a sectional view illustrating a substrate processing apparatus of FIG. 1;

DETAILED DESCRIPTION

Figure 1:
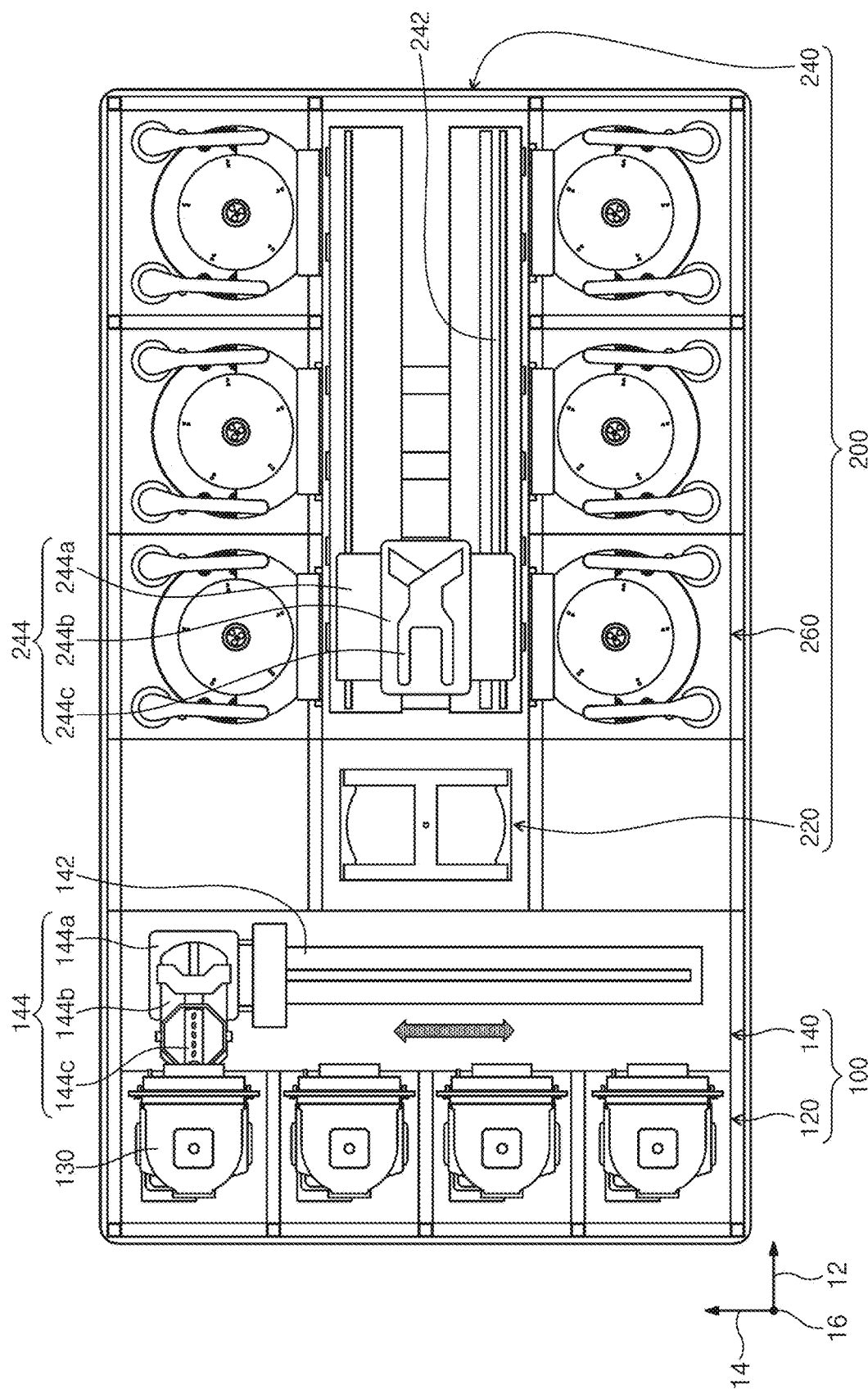
FIG. 1 is a plan view illustrating substrate processing equipment according to an embodiment of the inventive concept.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

Hereinafter, embodiments of the inventive concept will be described in detail with reference to FIGS. 1 to 8.

FIG. 1 is a plan view illustrating substrate processing equipment according to an embodiment of the inventive concept. Referring to FIG. 1, the substrate processing equipment 10 includes an index module 100 and a process module 200. The index module 100 has a load port 120 and a transfer frame 140. The load port 120, the transfer frame 140, and the process module 200 are sequentially arranged in a row. Hereinafter, a direction in which the load port 120, the transfer frame 140, and the process module 200 are arranged is referred to as a first direction 12, a direction perpendicular to the first direction 12 when viewed from above is referred to as a second direction 14, and a direction perpendicular to the plane including the first direction 12 and the second direction 14 is referred to as a third direction 16.

A carrier 130 having substrates W received therein is seated on the load port 120. A plurality of load ports 120 may be provided. The load ports 120 may be disposed in a row along the second direction 14. The number of load ports 120 may be increased or decreased depending on process efficiency and footprint of the process module 200. The carrier 130 has a plurality of slots (not illustrated) formed therein in which the substrates W are received in horizontal positions relative to the ground. A front opening unified pod (FOUP) may be used as the carrier 130.

The process module 200 has a buffer unit 220, a transfer chamber 240, and process chambers 260. The transfer chamber 240 is disposed such that the lengthwise direction thereof is parallel to the first direction 12. The process chambers 260 are disposed on opposite sides of the transfer chamber 240. On the opposite sides of the transfer chamber 240, the process chambers 260 are provided to be symmetric to each other with respect to the transfer chamber 240. A plurality of process chambers 260 are provided on one side of the transfer chamber 240. Some of the process chambers 260 are disposed along the lengthwise direction of the transfer chamber 240. Furthermore, the other process chambers 260 are stacked one above another. That is, the process chambers 260 may be disposed in an A×B array on the one side of the transfer chamber 240. Here, "A" denotes the number of process chambers 260 provided in a row along the first direction 12, and "B" denotes the number of process chambers 260 provided in a column along the third direction 16. In a case where four or six process chambers 260 are provided on the one side of the transfer chamber 240, the process chambers 260 may be disposed in a 2×2 or 3×2 array. The number of process chambers 260 may be increased or decreased. Alternatively, the process chambers 260 may be provided on only the one side of the transfer chamber 240. In another case, the process chambers 260 may be provided in a single layer on the opposite sides of the transfer chamber 240.

The buffer unit 220 is disposed between the transfer frame 140 and the transfer chamber 240. The buffer unit 220 provides a space in which the substrates W stay before transferred between the transfer chamber 240 and the transfer frame 140. The buffer unit 220 has slots (not illustrated) formed therein in which the substrates W are placed. The slots (not illustrated) are spaced apart from each other along the third direction 16. The buffer unit 220 is open at one side facing the transfer frame 140 and at an opposite side facing the transfer chamber 240.

The transfer frame 140 transfers the substrates W between the carriers 130 seated on the load ports 120 and the buffer unit 220. An index rail 142 and an index robot 144 are provided in the transfer frame 140. The index rail 142 is disposed such that the lengthwise direction thereof is parallel to the second direction 14. The index robot 144 is installed on the index rail 142 and rectilinearly moves along the index rail 142 in the second direction 14. The index robot 144 has a base 144a, a body 144b, and an index arm 144c. The base 144a is installed so as to be movable along the index rail 142. The body 144b is coupled to the base 144a. The body 144b is movable on the base 144a along the third direction 16. Furthermore, the body 144b is rotatable on the base 144a. The index arm 144c is coupled to the body 144b and is movable forward and backward relative to the body 144b. A plurality of index arms 144c may be provided. The index arms 144c may be individually driven. The index arms 144c may be stacked one above another with a spacing gap therebetween along the third direction 16. Some of the index arms 144c may be used to transfer the substrates W from the process module 200 to the carriers 130, and the other index arms 144c may be used to transfer the substrates W from the carriers 130 to the process module 200. Accordingly, particles generated from the substrates W that are to be processed may be prevented from adhering to the processed substrates W in a process in which the index robot 144 transfers the substrates W between the carriers 130 and the process module 200.

The transfer chamber 240 transfers the substrates W between the buffer unit 220 and the process chambers 260 and between the process chambers 260. A guide rail 242 and a main robot 244 are provided in the transfer chamber 240. The guide rail 242 is disposed such that the lengthwise direction thereof is parallel to the first direction 12. The main robot 244 is installed on the guide rail 242 and rectilinearly moves on the guide rail 242 along the first direction 12. The main robot 244 has a base 244a, a body 244b, and a main arm 244c. The base 244a is installed so as to be movable along the guide rail 242. The body 244b is coupled to the base 244a. The body 244b is movable on the base 244a along the third direction 16. Furthermore, the body 244b is rotatable on the base 244a. The main arm 244c is coupled to the body 244b and is movable forward and backward relative to the body 244b. A plurality of main arms 244c may be provided. The main arms 244c may b e individually driven. The main arms 244c may be stacked one above another with a spacing gap therebetween along the third direction 16.

The process chambers 260 are equipped with substrate processing apparatuses 300 that perform liquid treatment processes on the substrates W. The substrate processing apparatuses 300 may have different structures depending on the types of cleaning processes performed therein. Alternatively, the substrate processing apparatuses 300 in the respective process chambers 260 may have the same structure. Selectively, the process chambers 260 may be divided into a plurality of groups. The substrate processing apparatuses 300 in the process chambers 260 belonging to the same group may have the same structure, and the substrate processing apparatuses 300 in the process chambers 260 belonging to different groups may have different structures.

Each of the substrate processing apparatuses 300 performs a liquid treatment process on a substrate W. In this embodiment, the liquid treatment process for the substrate W will be exemplified by a cleaning process. Without being limited to the cleaning process, however, the liquid treatment process may include various processes such as a photolithography process, an ashing process, an etching process, and the like.

Figure 2:
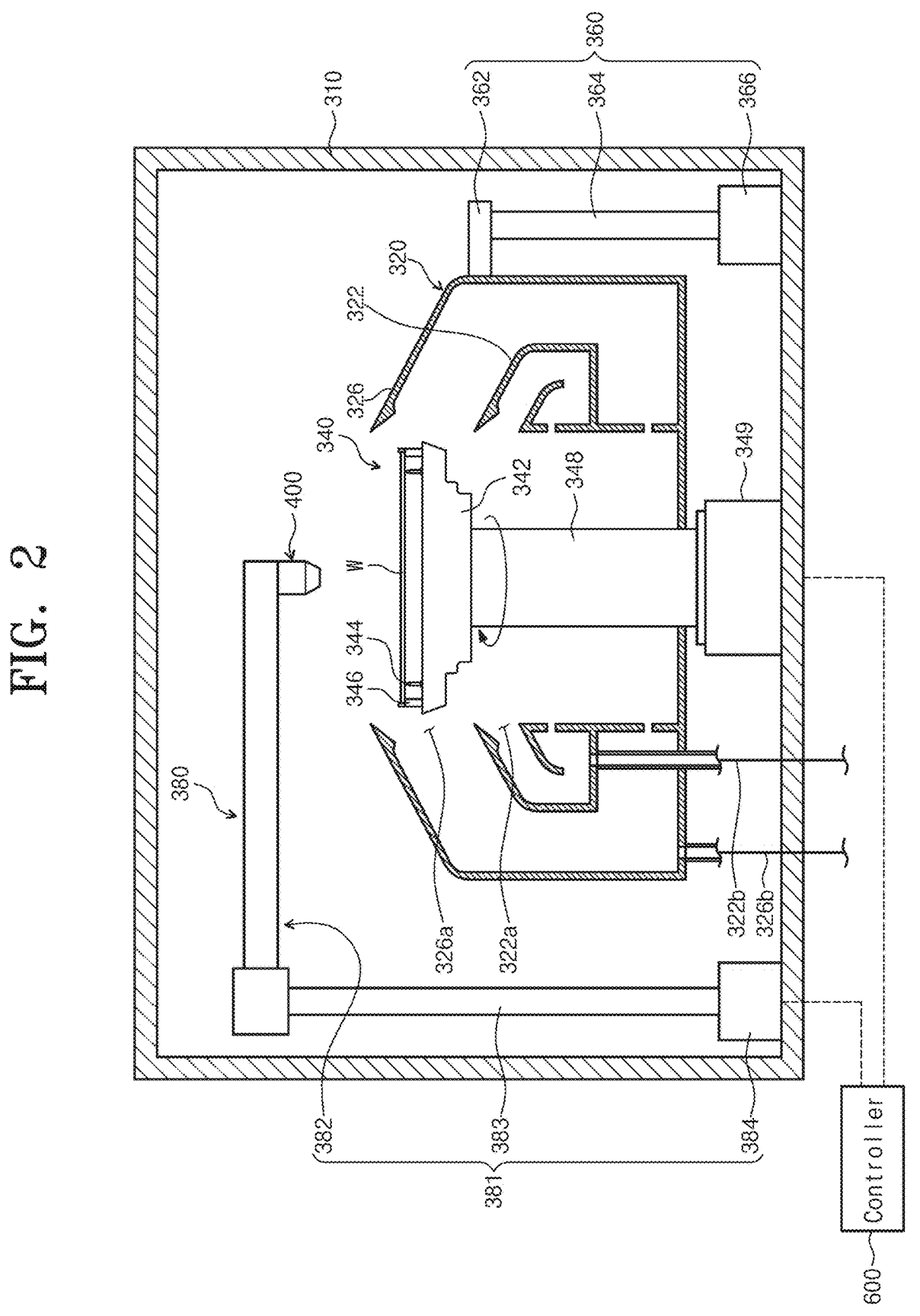

FIG. 2 is a sectional view illustrating the substrate processing apparatus of FIG. 1. Referring to FIG. 2, the substrate processing apparatus 300 includes a housing 310, a processing vessel 320, a support unit 340, a lifting unit 360, a liquid dispensing unit 380, and a controller 600.

The housing 310 has a processing space 312 therein. The housing 310 may have a container shape having a space therein. The processing vessel 320, the support unit 340, the lifting unit 360, and the liquid dispensing unit 380 may be provided in the processing space 312 of the housing 310. The housing 310 may have a quadrangular shape when viewed from the front. Without being limited thereto, however, the housing 310 may have various shapes having the processing space 312 therein.

The processing vessel 320 has a container shape that is open at the top. The processing vessel 320 has an inner recovery bowl 322 and an outer recovery bowl 326. The recovery bowls 322 and 326 recover different treatment liquids used for processes. The inner recovery bowl 322 has an annular ring shape that surrounds the support unit 340, and the outer recovery bowl 326 has an annular ring shape that surrounds the inner recovery bowl 322. An inner space 322a of the inner recovery bowl 322 and the inner recovery bowl 322 function as the first inlet 322a through which a treatment liquid is introduced into the inner recovery bowl 322. A space 326a between the inner recovery bowl 322 and the outer recovery bowl 326 functions as the second inlet 326a through which a treatment liquid is introduced into the outer recovery bowl 326. According to an embodiment, the inlets 322a and 326a may be located at different heights. Recovery lines 322b and 326b are connected to the bottoms of the recovery bowls 322 and 326, respectively. The treatment liquids introduced into the recovery bowls 322 and 326 may be delivered to an external treatment liquid regeneration system (not illustrated) through the recovery lines 322b and 326b and may be regenerated by the regeneration system.

The support unit 340 supports the substrate W in the processing space 312. The support unit 340 supports and rotates the substrate W during a process. The support unit 340 has a support plate 342, a support pin 344, a chuck pin 346, and a rotary drive member 348 and 349.

The support plate 342 is provided in a substantially circular plate shape and has an upper surface and a lower surface. The lower surface has a smaller diameter than the upper surface. That is, the support plate 342 may have a shape that is wide at the top and narrow at the base. The upper surface and the lower surface are located such that the central axes thereof are in agreement with each other. A heating unit (not illustrated) may be provided inside the support plate 342. The heating unit inside the support plate 342 may heat the substrate W placed on the support plate 342. The heating unit may generate heat. The heat generated by the heating unit may be warm-heat or cold-heat. The heat generated by the heating unit may be transferred to the substrate W placed on the support plate 342. The heat transferred to the substrate W may heat a treatment liquid dispensed onto the substrate W. The heating unit may be a heater and/or a cooling coil. Without being limited thereto, however, the heating unit may be implemented with various well-known devices.

The support plate 342 is equipped with a plurality of support pins 344. The support pins 344 are disposed on an edge portion of the upper surface of the support plate 342 so as to be spaced apart from each other at predetermined intervals. The support pins 344 protrude upward from the support plate 342. The support pins 344 are disposed to form an annular ring shape as a whole by a combination thereof. The support pins 344 support the edge of the rear surface of the substrate W such that the substrate W is spaced apart from the upper surface of the support plate 342 by a predetermined distance.

The support plate 342 is equipped with a plurality of chuck pins 346. The chuck pins 346 are disposed farther away from the center of the support plate 342 than the support pins 344. The chuck pins 346 protrude upward from the upper surface of the support plate 342. The chuck pins 346 support the side of the substrate W such that the substrate W does not deviate from a correct position to a side when the support plate 342 is rotated. The chuck pins 346 are rectilinearly movable between an outer position and an inner position along the radial direction of the support plate 342. The outer position is a position farther away from the center of the support plate 342 than the inner position. When the substrate W is loaded onto or unloaded from the support plate 342, the chuck pins 346 are located in the outer position, and when a process is performed on the substrate W, the chuck pins 346 are located in the inner position. The inner position is a position in which the chuck pins 346 and the side of the substrate W are brought into contact with each other, and the outer position is a position in which the chuck pins 346 and the substrate W are spaced apart from each other.

The rotary drive member 348 and 349 rotates the support plate 342. The support plate 342 is rotatable about the central axis thereof by the rotary drive member 348 and 349. The rotary drive member 348 and 349 includes a support shaft 348 and an actuator 349. The support shaft 348 has a cylindrical shape facing in the third direction 16. An upper end of the support shaft 348 is fixedly coupled to the lower surface of the support plate 342. According to an embodiment, the support shaft 348 may be fixedly coupled to the center of the lower surface of the support plate 342. The actuator 349 provides a driving force to rotate the support shaft 348. The support shaft 348 is rotated by the actuator 349, and the support plate 342 is rotatable together with the support shaft 348.

The lifting unit 360 rectilinearly moves the processing vessel 320 in an up-down direction. The height of the processing vessel 320 relative to the support plate 342 is changed as the processing vessel 320 is moved in the up-down direction. The lifting unit 360 lowers the processing vessel 320 such that the support plate 342 further protrudes upward beyond the processing vessel 320 when the substrate W is loaded onto or unloaded from the support plate 342. Furthermore, while a process is performed, the height of the processing vessel 320 is adjusted depending on the types of treatment liquids dispensed onto the substrate W, such that the treatment liquids are introduced into the preset recovery bowls 322 and 326. The lifting unit 360 has a bracket 362, a movable shaft 364, and an actuator 366. The bracket 362 is fixedly attached to an outer wall of the processing vessel 320, and the movable shaft 364 is fixedly coupled to the bracket 362 and is moved in the up-down direction by the actuator 366. Selectively, the lifting unit 360 may move the support plate 342 in the up-down direction.

The liquid dispensing unit 380 dispenses a treatment liquid onto the substrate W. The liquid dispensing unit 380 may dispense, onto the substrate W, a treatment liquid in which plasma is generated. The treatment liquid may be a chemical, a rinsing solution, a wetting solution, a cleaning solution, or an organic solvent. The chemical may be a liquid having a property of acid or base. The chemical may include sulfuric acid ($H_2SO_4$), phosphoric acid ($P_2O_5$), hydrofluoric acid (HF), and ammonium hydroxide ($NH_4OH$). The chemical may be a diluted sulfuric acid peroxide (DSP) mixture.

The cleaning solution, the rinsing solution, and the wetting solution may be deionized water ($H_2O$). The organic solvent may be isopropyl alcohol (IPA).

The liquid dispensing unit 380 may include a moving member 381 and a nozzle 400. The moving member 381 moves the nozzle 400 between a process position and a standby position. The process position is a position in which the nozzle 400 faces the substrate W supported on the support unit 340. According to an embodiment, the process position is a position in which the nozzle 400 dispenses a treatment liquid onto the upper surface of the substrate W. The process position includes a first dispensing position and a second dispensing position. The first dispensing position may be a position closer to the center of the substrate W than the second dispensing position, and the second dispensing position may be a position including an end portion of the substrate W. Selectively, the second dispensing position may be an area adjacent to the end portion of the substrate W. The standby position is defined as a position in which the nozzle 400 deviates from the process position. According to an embodiment, the standby position may be a position in which the nozzle 400 stands by before or after the substrate W is processed.

The moving member 381 includes an arm 382, a support shaft 383, and an actuator 384. The support shaft 383 is located on one side of the processing vessel 320. The support shaft 383 has a rod shape, the lengthwise direction of which is parallel to the third direction 16. The support shaft 383 is rotatable by the actuator 384. The support shaft 383 is movable upward and downward. The arm 382 is coupled to an upper end of the support shaft 383. The arm 382 extends from the support shaft 383 at a right angle thereto. The nozzle 400 is coupled to an end of the arm 400. A liquid supply unit for supplying a treatment liquid to the nozzle 400 may be provided inside the arm 382. Furthermore, a gas supply unit for supplying a gas to the nozzle 400 may be provided inside the arm 382. The liquid supply unit and the gas supply unit may each include a valve (not illustrated). The valve (not illustrated) may be an on/off valve or a flow-rate control valve. The nozzle 400 may be coupled to the arm 382 such that the angle at which the nozzle 400 dispenses the treatment liquid onto the upper surface of the substrate W is adjustable. As the support shaft 383 is rotated, the nozzle 400 may be swung together with the arm 382. The nozzle 400 may be swung between the process position and the standby position. Selectively, the arm 382 is movable forward and backward along the lengthwise direction thereof. When viewed from above, the path along which the nozzle 400 is moved may be in agreement with the central axis of the substrate W in the process position.

The controller 600 may control the substrate processing apparatus 300. The controller 600 may control the components of the substrate processing apparatus 300. For example, the controller 600 may control the support unit 340 and the liquid dispensing unit 380. Furthermore, the controller 600 may control the substrate processing apparatus 300 to perform a substrate processing method that will be described below. For example, the controller 600 may control the support unit 340 and the liquid dispensing unit 380 to perform the substrate processing method that will be described below.

Figure 3:
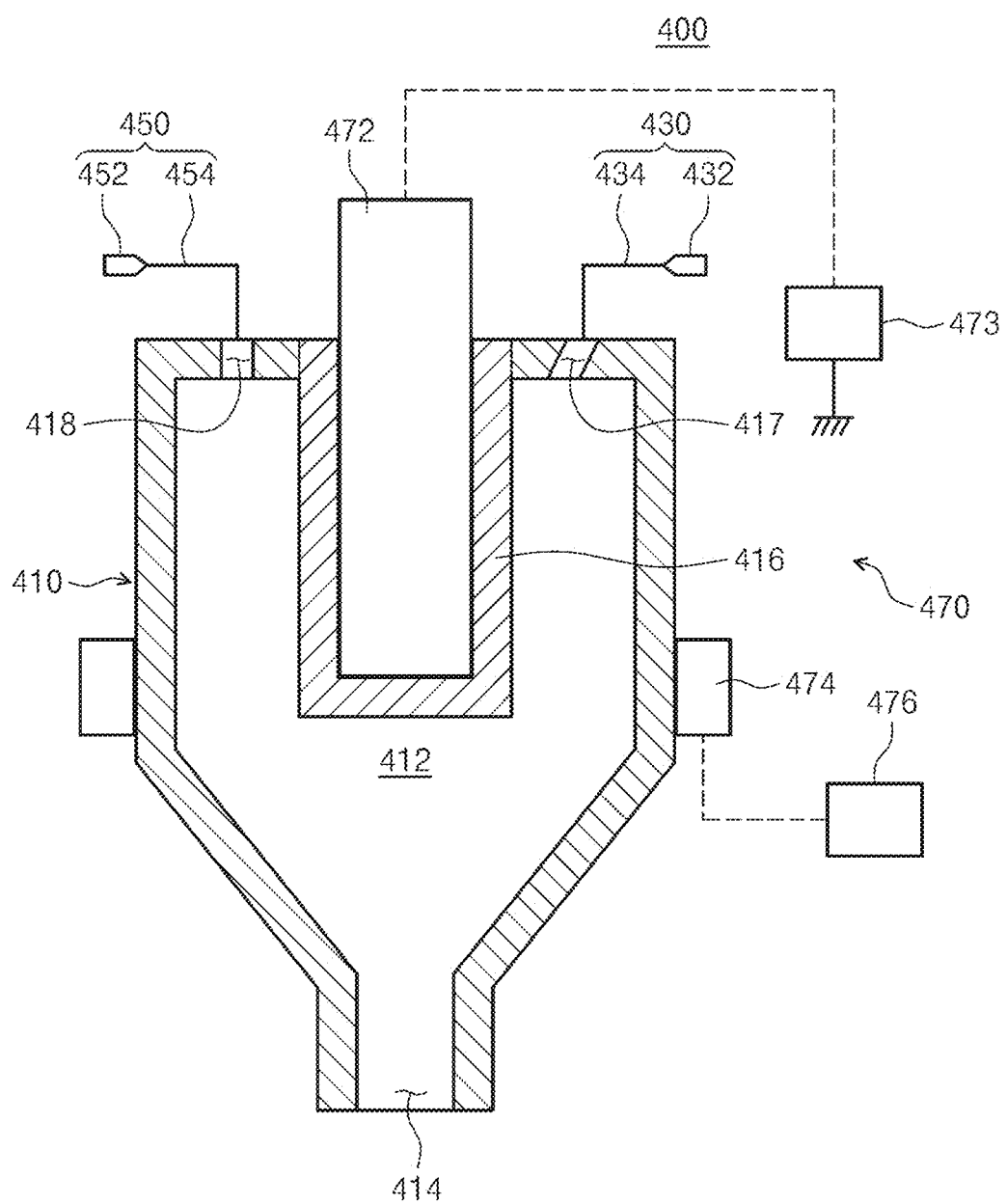
FIG. 3 is a sectional view illustrating a nozzle of FIG. 2.

Hereinafter, the nozzle 400 according to an embodiment of the inventive concept will be described in detail with reference to FIG. 3. FIG. 3 is a sectional view illustrating the nozzle of FIG. 2. Referring to FIG. 3, the nozzle 400 may include a body 410, a liquid supply unit 430, a gas supply unit 450, and a plasma generation unit 470.

The body 410 may have an interior space 412. The body 410 may be implemented with an insulator. The body 410 may be formed of a material containing quartz. The body 410 may have a dispensing opening 414 formed therein. The dispensing opening 414 may be formed in a lower end of the body 410. The dispensing opening 414 may be configured to dispense a treatment liquid, which is introduced into the interior space 412, in the manner of a stream. The dispensing opening 414 may be a hole. The dispensing opening 414 may be a circular hole. Without being limited thereto, however, the dispensing opening 414 may be implemented in various shapes capable of dispensing the treatment liquid in the manner of a stream. When the dispensing opening 414 dispenses the treatment liquid in the manner of a stream, damage to a pattern formed on the substrate W may be relatively minimized, as compared with when the treatment liquid is dispensed in the manner of a mist.

The body 410 may include a discharge part and a dispensing part. The discharge part may be an area in which the plasma generation unit 470 generates plasma. The dispensing part may be an area through which the treatment liquid in which the plasma is generated is delivered to the dispensing opening 414. The dispensing part may extend downward from the discharge part and may have a gradually decreasing width toward the dispensing opening 414.

The body 410 may further include an insulating part 416. The insulating part 416 may be an insulator. The insulating part 416 may be formed of a material containing quartz. The insulating part 416 may be provided in the interior space 412. A portion of the insulating part 416 may be provided in the interior space 412. The insulating part 416 may be inserted into the interior space 412 through an opening formed in the body 410. The opening formed in the body 410 may have a circular shape. The insulating part 416 may have a container shape that is open at the top. For example, the insulating part 416 may have a cylindrical shape that is open at the top. A first electrode 472, which will be described below, may be inserted into the insulating part 416. That is, the insulating part 416 may surround the first electrode 472.

A liquid inlet port 417 may be formed in the body 410. The liquid inlet port 417 may be formed in an upper portion of the body 410. The liquid inlet port 417 may provide a passage through which the treatment liquid is introduced into the interior space 412. The liquid inlet port 417 may be provided such that the treatment liquid introduced into the interior space 412 from the liquid inlet port 417 collides with an inner wall of the body 410. For example, the liquid inlet port 417 may be provided to be oblique when viewed from the front of the body 410. The liquid inlet port 417 may be implemented with an inclined opening when viewed from the front of the body 410. Accordingly, the treatment liquid introduced into the interior space 412 from the liquid inlet port 417 may collide with the inner wall of the body 410 to bubble in the interior space 412. The liquid inlet port 417 is not limited to the inclined opening and may be implemented in various shapes capable of causing the treatment liquid to bubble in the interior space 412. The liquid inlet port 417 may be connected with a liquid supply line 434 that will be described below.

A gas inlet port 418 may be formed in the body 410. The gas inlet port 418 may be formed in the upper portion of the body 410. The gas inlet port 418 may provide a passage through which a gas is introduced into the interior space 412. The gas inlet port 418 may be implemented with a straight opening when viewed from the front of the body 410. Without being limited thereto, however, the gas inlet port 418 may be implemented with an inclined opening, similarly to the liquid inlet port 417. The gas inlet port 418 may be connected with a gas supply line 454 that will be described below.

The liquid supply unit 430 may supply the treatment liquid into the interior space 412. The liquid supply unit 430 may include a liquid supply source 432 and the liquid supply line 434. The liquid supply source 432 may store the treatment liquid that the nozzle 400 dispenses. The liquid supply source 432 may be a source that stores the treatment liquid. The treatment liquid stored by the liquid supply source 432 may be a cleaning solution. The cleaning solution may be deionized water. The liquid supply source 432 may be connected with the liquid supply lines 434. The liquid supply line 434 may deliver the treatment liquid from the liquid supply source 432 to the liquid inlet port 417. The liquid supply line 434 may be equipped with a valve (not illustrated). The valve may be an on/off valve or a flow-rate control valve.

The liquid supply unit 430 may supply the treatment liquid in a bubbling state into the interior space 412. For example, the liquid supply source 432 may cause the treatment liquid to bubble therein and may deliver the treatment liquid in the bubbling state to the liquid supply line 434. Alternatively, the liquid supply source 432 may deliver the treatment liquid to the liquid supply line 434, and the treatment liquid may bubble in the liquid supply line 434. In another case, the liquid supply unit 430 may be provided such that the treatment liquid supplied into the interior space 412 bubbles in the interior space 412. For example, the liquid supply line 434 of the liquid supply unit 430 may be connected with the liquid inlet port 417 that is an inclined opening. The treatment liquid supplied into the interior space 412 through the liquid supply line 434 may collide with the inner wall of the body 410 to bubble in the interior space 412.

The gas supply unit 450 may supply the gas into the interior space 412. The gas supply unit 450 may include a gas supply source 452 and the gas supply line 454. The gas supply source 452 may store the gas that is supplied into the interior space 412. The gas stored by the gas supply source 452 may be a gas that is excited into plasma. The gas stored by the gas supply source 452 may be excited into plasma by electric power applied by the plasma generation unit 470 that will be described below. The gas stored by the gas supply source 452 may be at least one of argon gas, hydrogen gas, oxygen gas, nitrogen gas, or carbon dioxide gas. The gas supply source 452 may supply, into the interior space 412, a gas selected from different types of gases. That is, the gas supply source 452 may variously change the types of active radicals of plasma contained in the treatment liquid, by varying the type of the gas supplied into the interior space 412. The gas supply source 452 may be connected with the gas supply line 454. The gas supply line 454 may deliver the gas from the gas supply source 452 to the gas inlet port 418. The gas supply line 454 may be equipped with a valve (not illustrated). The valve may be an on/off valve or a flow-rate control valve.

The plasma generation unit 470 may generate plasma in the interior space 412. The plasma generation unit 470 may include electrodes 472 and 474, a power supply 473, and an actuator 476.

The electrodes 472 and 474 may include the first electrode 472 and the second electrode 474. The first electrode 472 may have a bar shape. The first electrode 472 may be inserted into the insulating part 416 included in the body 410. The first electrode 472 may be provided in the interior space 412. The first electrode 472 provided in the interior space 412 may be surrounded by the insulating part 416. Accordingly, a risk that the first electrode 472 is damaged by being brought into contact with the treatment liquid may be minimized. The second electrode 474 may have a ring shape. The second electrode 474 may have a circular ring shape. The second electrode 474 may surround the interior space 412. For example, the second electrode 474 may be provided on the exterior of the body 410.

One of the first electrode 472 and the second electrode 474 may be connected with the power supply 473 that applies electric power, and the other may be grounded. For example, the first electrode 472 may be connected with the power supply 472, and the second electrode 474 may be grounded. Without being limited thereto, however, the second electrode 474 may be connected with the power supply 473, and the first electrode 472 may be grounded.

The electrodes 472 and 474 may be provided so as to be movable. The electrodes 472 and 474 may be movable to change a discharge region of the interior space 412 in which plasma is generated from the treatment liquid or the gas. One of the first electrode 472 and the second electrode 474 may be fixed, and the other may be movable to change the discharge region along the lengthwise direction of the nozzle 400. For example, the first electrode 472 may be fixed, and the second electrode 474 may be movable along the lengthwise direction of the first electrode 472. The actuator 476 may be connected with the second electrode 474 and may change the position of the second electrode 474.

Hereinafter, a substrate processing method according to an embodiment of the inventive concept will be described in detail with reference to FIGS. 4 and 5. To perform the substrate processing method, the controller 600 may control the liquid dispensing unit 380.

Figure 4:
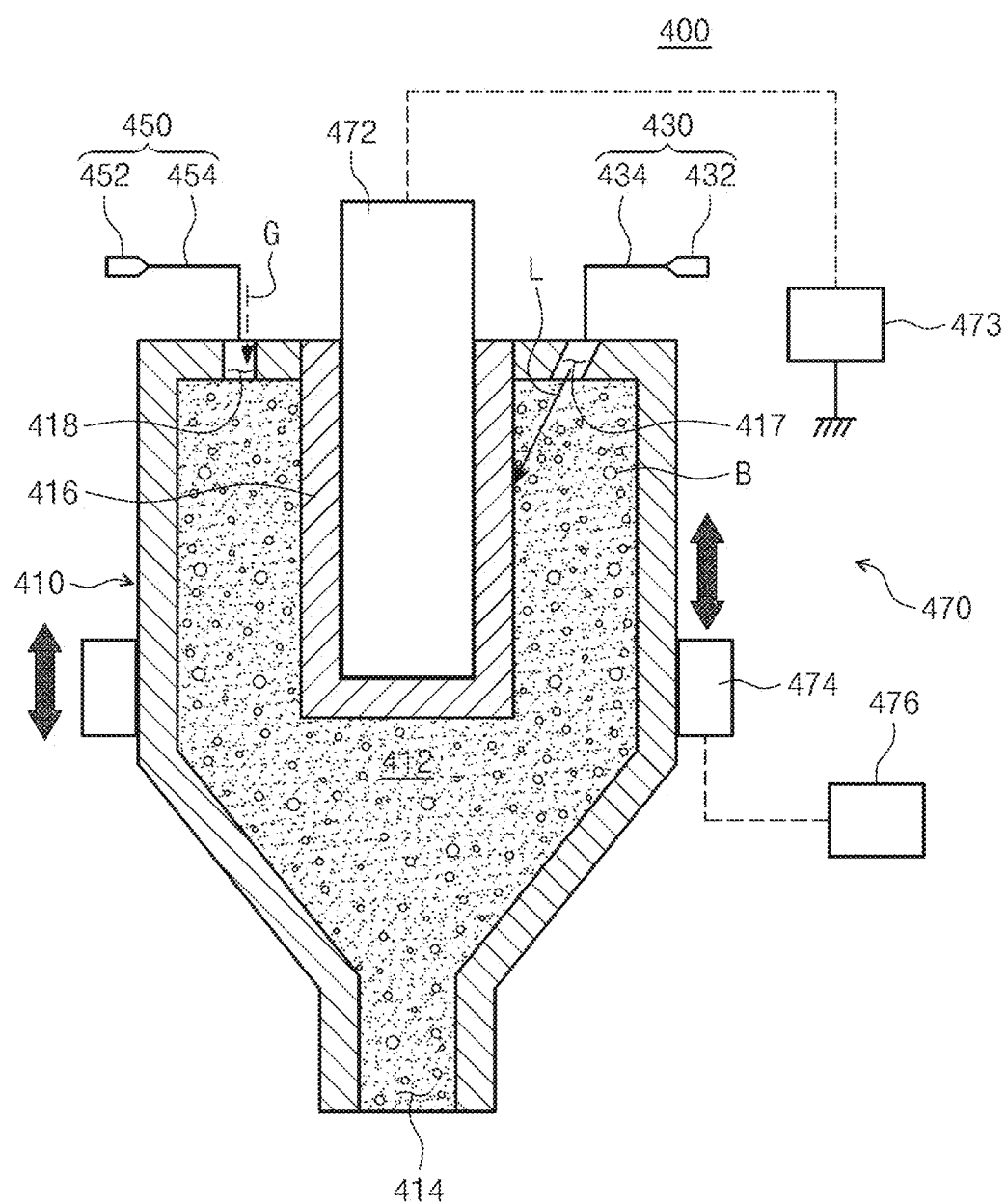
FIG. 4 is a view illustrating a state in which plasma is generated in the nozzle of FIG. 2.
Figure 5:
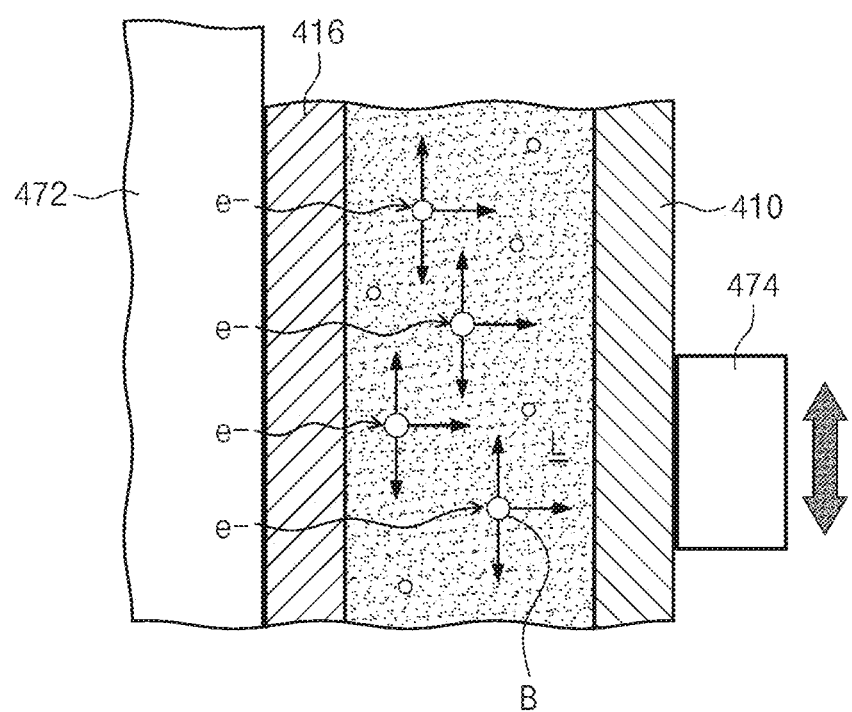
FIG. 5 is a view illustrating part of the nozzle of FIG. 4.

FIG. 4 is a view illustrating a state in which plasma is generated in the nozzle of FIG. 2, and FIG. 5 is a view illustrating part of the nozzle of FIG. 4. Referring to FIGS. 4 and 5, in a substrate processing method according to an embodiment of the inventive concept, the nozzle 400 may dispense a treatment liquid L onto the substrate W to process the substrate W. At this time, the nozzle 400 may generate plasma in the treatment liquid L and may dispense the treatment liquid L, in which the plasma is generated, onto the substrate W. The plasma contained in the treatment liquid L may be generated through bubbles B produced by the treatment liquid L that bubbles in the nozzle 400. Furthermore, the plasma contained in the treatment liquid L may be generated through a gas G.

When the treatment liquid L in a bubbling state is supplied into the interior space 412 or the treatment liquid L bubbles in the interior space 412, the bubbles B are produced in the treatment liquid L. At this time, the electrodes 472 and 474 may apply voltage to the bubbles B to generate plasma. The permittivity of the bubbles B is significantly lower than the permittivity of the treatment liquid L in a liquid state. For example, in a case where the treatment liquid L is deionized water, the permittivity of the treatment liquid L is 80.4, and the permittivity of the bubbles B is 1.0. An electric field generated by the electrodes 472 and 474 is applied to the bubbles B having a low permittivity. Accordingly, plasma discharge is generated even by low critical voltage. That is, plasma discharge efficiency may be significantly improved. In other words, electric power consumed to generate plasma in the treatment liquid L may be minimized. Furthermore, even if the same electric power is applied, a plasma generation rate may be relatively significantly increased.

According to an embodiment of the inventive concept, the positions of the electrodes 472 and 474 may be changed. For example, the position of the second electrode 474 may be changed. Accordingly, the discharge region of the interior space 412 in which plasma is generated from the bubbles B contained in the treatment liquid L may be changed. That is, the change in the position of the second electrode 474 may minimize a limitation in the discharge region and may enable prevention of electrification. Furthermore, in generating plasma by changing the position of the second electrode 474, an additional control factor may be provided. Moreover, the position of the second electrode 474 may be changed while the nozzle 400 dispenses the treatment liquid L. The second electrode 474 may be moved downward or upward.

Figure 6:
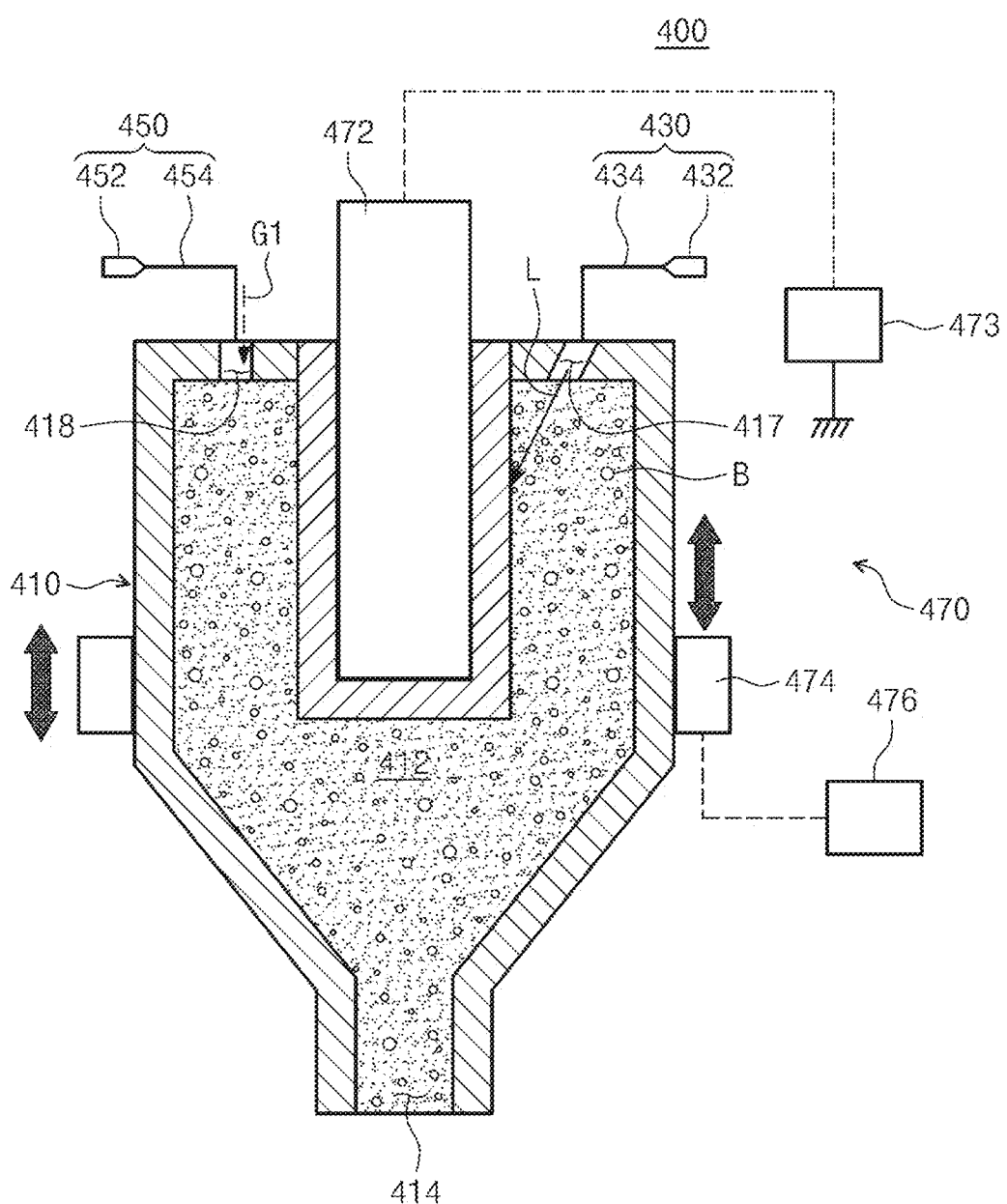
FIGS. 6 and 7 are views illustrating states in which different types of gases are supplied into an interior space of the nozzle.
Figure 7:
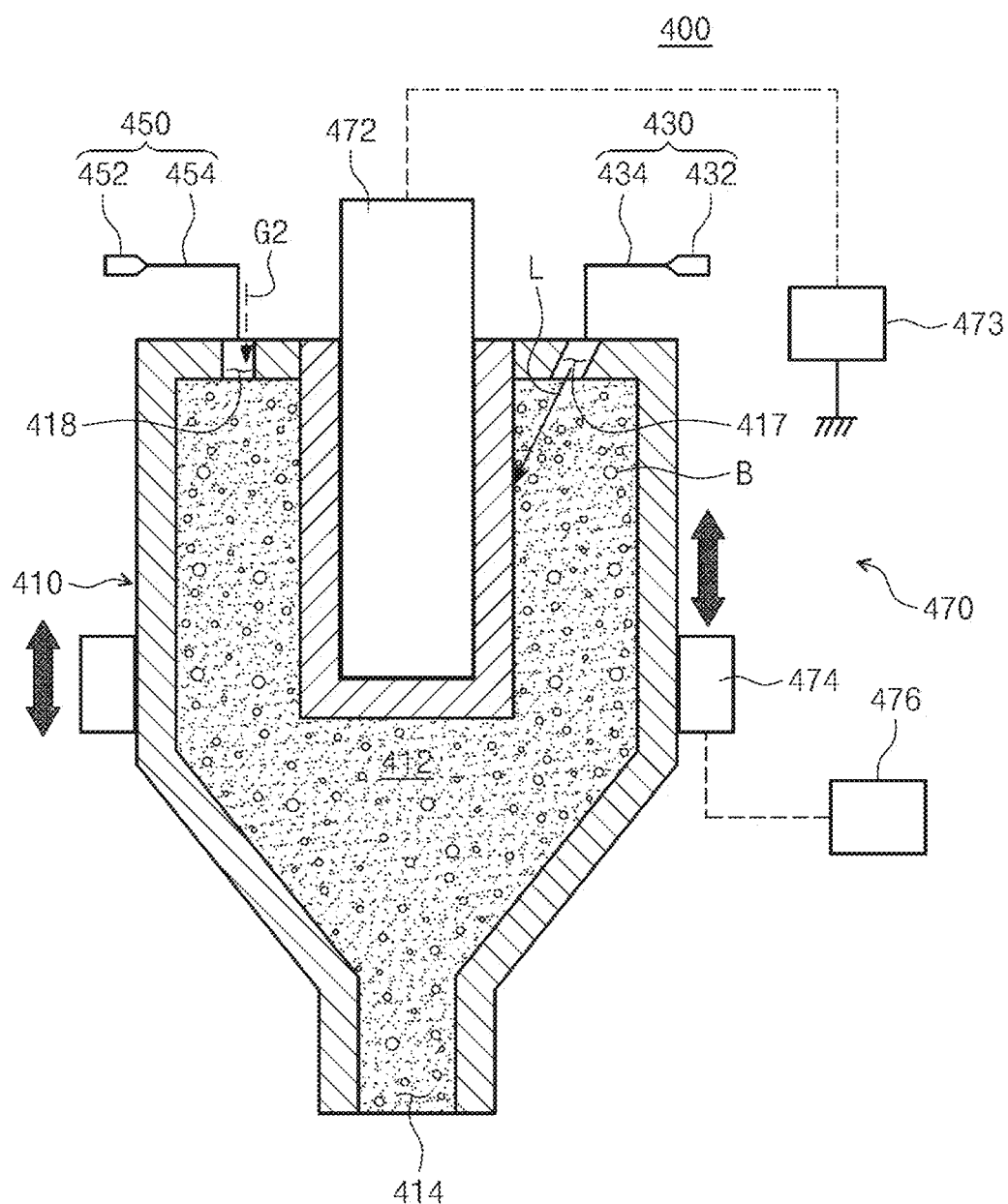

The gas supply unit 450 may supply the gas G into the interior space 412. The gas G may cause the treatment liquid L supplied into the interior space 412 to bubble in the interior space 412. The gas G supplied into the interior space 412 may be excited by the plasma generation unit 470. Accordingly, the gas G supplied into the interior space 412 may be a source of active radicals. The type of the gas supplied into the interior space 412 may be changed depending on the type of the substrate W processed by the treatment liquid L. For example, as illustrated in FIGS. 6 and 7, a first gas G1 may be supplied into the interior space 412 when a first substrate is processed. Furthermore, a second gas G2 may be supplied into the interior space 412 when a second substrate different from the first substrate is processed. That is, the type of the gas supplied into the interior space 412 may be changed depending on the type of the substrate W to be processed, for example, an impurity remaining on the substrate W. According to an embodiment of the inventive concept, the types of active radicals contained in the treatment liquid L dispensed onto the substrate W may be variously changed.

Furthermore, according to an embodiment of the inventive concept, the inventive concept may supply, onto the substrate W, a cleaning solution in which plasma is generated, thereby improving efficiency in processing the substrate W. Accordingly, the inventive concept may minimize environmental pollution without using a chemical or by reducing the amount of a chemical used.

Figure 8:
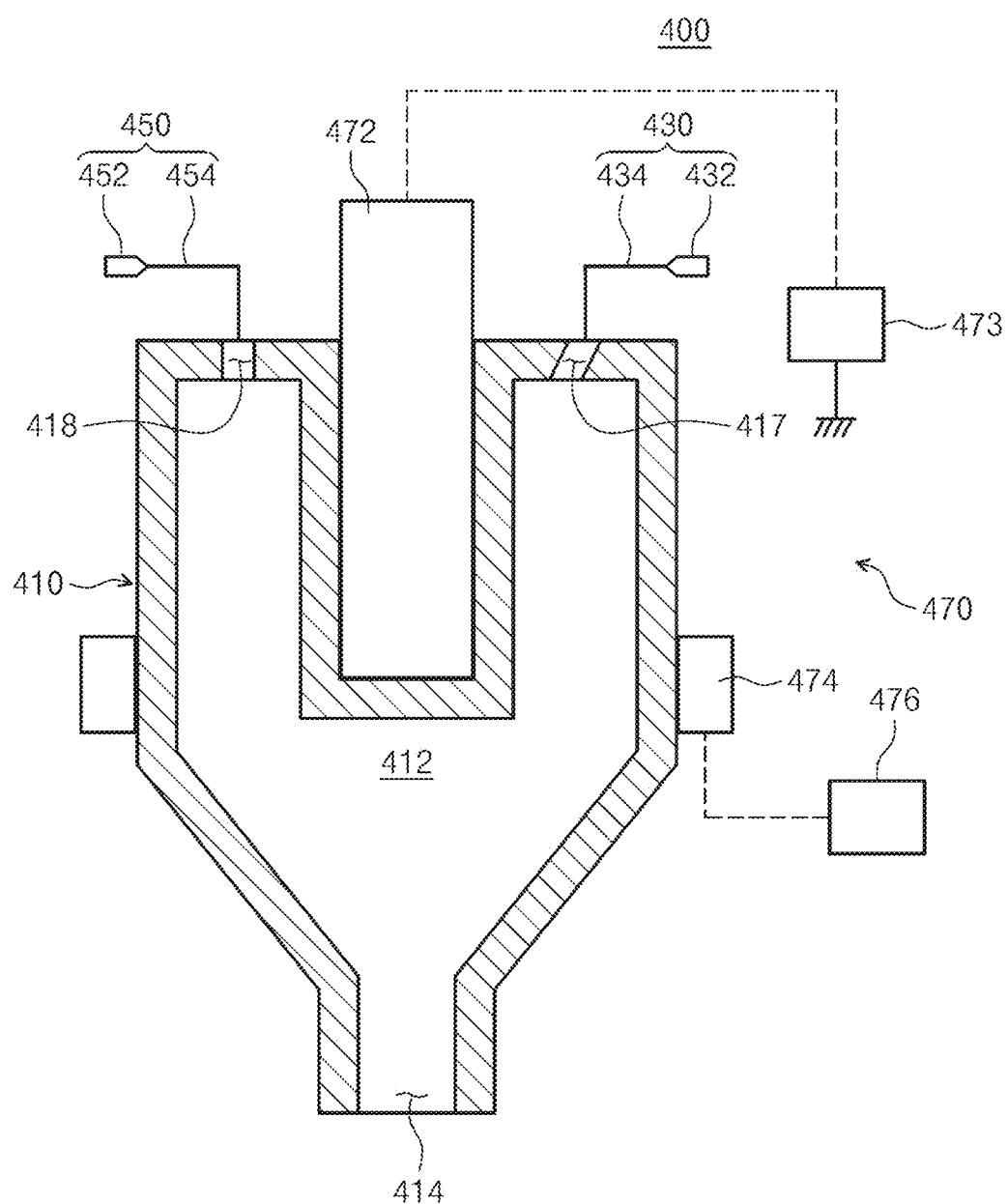
FIG. 8 is a sectional view illustrating a nozzle according to another embodiment of the inventive concept.

Although it has been exemplified that the opening is formed in the body 410 and the insulating part 416 is inserted into the opening, the inventive concept is not limited thereto. For example, as illustrated in FIG. 8, a recess may be formed on the body 410, and the first electrode 472 may be inserted into the recess formed on the body 410.

Although it has been exemplified that the cleaning solution is dispensed onto the substrate W to process the substrate W, the inventive concept is not limited thereto. For example, the above-described embodiments may be identically applied to all apparatuses and methods for processing a substrate W by dispensing a treatment liquid onto the substrate W.

As described above, according to the embodiments of the inventive concept, a substrate may be efficiently processed.

Furthermore, according to the embodiments of the inventive concept, impurities adhering to a substrate may be effectively removed.

Moreover, according to the embodiments of the inventive concept, plasma may be efficiently generated in a treatment liquid to be dispensed onto a substrate.

In addition, according to the embodiments of the inventive concept, in generating plasma in a treatment liquid, an additional factor may be provided.

Effects of the inventive concept are not limited to the above-described effects, and it should be understood that effects of the inventive concept include all effects that can be deduced from the detailed description of the inventive concept or the configurations of the inventive concept set forth in the claims.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for processing a substrate, the apparatus comprising:
    a housing having a processing space;
    a support unit configured to support the substrate in the processing space; and
    a liquid dispensing unit including a nozzle configured to dispense a treatment liquid onto the substrate supported on the support unit,
    wherein the nozzle includes
        a body comprising an insulator wall and including an interior space, enclosed by the insulator wall, the body including (1) a recess defined by the insulator wall at an upper portion of the body and (2) a dispensing opening at a lower portion of the body, the dispensing opening configured to dispense the treatment liquid,
        a liquid supply unit configured to supply the treatment liquid into the interior space,
        a gas supply unit configured to supply a gas into the interior space, and
        electrodes configured to generate plasma in the interior space, the electrodes including a first electrode and a second electrode, the first electrode being inserted into the recess to be separated from the interior space by the insulator wall, the second electrode being on an exterior of the body and surrounding the interior space of the body, and
    wherein the liquid supply unit supplies the treatment liquid in a bubbling state into the interior space, or causes the treatment liquid to bubble in the interior space.

2. The apparatus of claim 1, wherein the liquid supply unit includes:
    a liquid supply source; and
    a liquid supply line configured to receive the treatment liquid from the liquid supply source,
    wherein a liquid inlet port connected with the liquid supply line is formed in the body, and wherein the liquid inlet port is provided such that the treatment liquid introduced into the interior space from the liquid inlet port collides with an inner wall of the body to bubble in the interior space.

3. The apparatus of claim 2, wherein the liquid inlet port is oblique when viewed in a vertical cross section of the body.

4. The apparatus of claim 1, wherein positions of the electrodes are changed to change a discharge region along a lengthwise direction of the nozzle, the discharge region being a region of the interior space in which the plasma is generated from the treatment liquid or the gas.

5. The apparatus of claim 4, wherein the nozzle further includes an actuator configured to change the positions of the electrodes.

6. The apparatus of claim 4, wherein
one of the first electrode and the second electrode is fixed, and the other is movable along the lengthwise direction of the nozzle.

7. The apparatus of claim 6, wherein
the second electrode is movable along a lengthwise direction of the first electrode.

8. The apparatus of claim 7, wherein one of the first electrode and the second electrode is connected with a power supply, and the other is grounded.

9. The apparatus of claim 8, wherein the first electrode is connected with the power supply, and the second electrode is grounded.

10. The apparatus of claim 1, wherein
the apparatus further comprises a controller configured to control the liquid dispensing unit,
the gas supply unit includes
a gas supply source, and
a gas supply line configured to receive the gas from the gas supply source, and
a gas inlet port connected with the gas supply line in the body, and
the controller is configured to control the gas supply source such that a type of the gas supplied into the interior space is changed depending on a type of the substrate to be processed.

11. The apparatus of claim 1, wherein the dispensing opening is defined in the body for dispensing the treatment liquid in a stream onto the substrate, which is supported on the support unit.

12. A nozzle for dispensing a treatment liquid in which plasma is generated, the nozzle comprising:
a body comprising an insulator wall and including an interior space enclosed by the insulator wall, the body including (1) a recess defined by the insulator wall at an upper portion of the body and (2) a dispensing opening at a lower portion of the body, the dispensing opening configured to dispense the treatment liquid;
a liquid supply unit configured to supply the treatment liquid into the interior space; and
electrodes configured to generate the plasma in the interior space, the electrodes including a first electrode and a second electrode, the first electrode being inserted into the recess to be separated from the interior space by the insulator wall, the second electrode being on an exterior of the body to surround the interior space of the body,
wherein the liquid supply unit supplies the treatment liquid in a bubbling state into the interior space, or causes the treatment liquid to bubble in the interior space.

13. The nozzle of claim 12, wherein
the liquid supply unit includes
a liquid supply source, and
a liquid supply line configured to receive the treatment liquid from the liquid supply source, and
a liquid inlet port connected with the liquid supply line in the body, and
the liquid inlet port is provided such that the treatment liquid introduced into the interior space from the liquid inlet port collides with an inner wall of the body to bubble in the interior space.

14. The nozzle of claim 13, wherein the liquid inlet port is oblique when viewed in a vertical cross section of the body.

15. The nozzle of claim 12, wherein positions of the electrodes are changed to change a discharge region along a lengthwise direction of the nozzle, the discharge region being a region of the interior space in which the plasma is generated from the treatment liquid.

16. The nozzle of claim 15, further comprising:
an actuator configured to change the positions of the electrodes.

17. The nozzle of claim 15, wherein
one of the first electrode and the second electrode is fixed, and the other is movable along the lengthwise direction of the nozzle.

18. The nozzle of claim 17,
wherein the second electrode is movable along a lengthwise direction of the first electrode.

19. The nozzle of claim 12, further comprising:
a gas supply unit configured to supply a gas into the interior space.

\* \* \* \* \*